US006417733B1

(12) United States Patent
Corsi et al.

(10) Patent No.: US 6,417,733 B1
(45) Date of Patent: Jul. 9, 2002

(54) HIGH OUTPUT VOLTAGE SWING CLASS AB OPERATIONAL AMPLIFIER OUTPUT STAGE

(75) Inventors: Marco Corsi; Priscilla Escobar-Bowser, both of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 55 days.

(21) Appl. No.: 09/610,171

(22) Filed: Jul. 5, 2000

Related U.S. Application Data

(60) Provisional application No. 60/142,494, filed on Jul. 6, 1999.

(51) Int. Cl.[7] .................................. H03F 3/26
(52) U.S. Cl. ........................ 330/273; 330/274
(58) Field of Search .................. 330/262, 267, 330/268, 273, 274

(56) References Cited

U.S. PATENT DOCUMENTS

| | | | | |
|---|---|---|---|---|
| 3,851,329 A | | 11/1974 | Kraus .................. 340/347 AD |
| 4,424,493 A | | 1/1984 | Schroeder ................ 330/263 |
| 4,467,226 A | | 8/1984 | Nagasawa ................ 307/315 |
| 4,482,868 A | * | 11/1984 | Whatley ................ 330/274 |
| 4,803,442 A | | 2/1989 | Hogg .................... 330/274 |
| 5,021,746 A | * | 6/1991 | Huynh ................... 330/262 |
| 5,229,721 A | | 7/1993 | Stade .................... 330/265 |
| 6,292,057 B1 | * | 9/2001 | Corsi et al. ............. 330/273 |

* cited by examiner

Primary Examiner—Steven J. Mottola
(74) Attorney, Agent, or Firm—April M. Mosby; W. James Brady; Frederick J. Telecky, Jr.

(57) ABSTRACT

An output stage (10) is provided having transistors of the same polarity type, which function to amplify the input signal at a wide range of frequencies, with low power consumption and low crossover distortion. By biasing the output transistors to remain on during both the positive and negative voltage swing of the input signal, low power consumption as well as low output crossover distortion is achieved. A high efficiency, low crossover distortion, current amplifier circuit for amplifying an input signal ($V_{IN}$) in accordance with this present invention includes an output driver (12), a current source ($I_{S1}$) and a translinear loop circuit (14). The output driver (12) includes a sourcing circuit ($Q_6$). The current source ($I_{S1}$), connected to the output driver (12), provides bias current to the sourcing circuit. The translinear loop circuit (14), connected to the output driver (12), receives the input signal ($V_{IN}$). The translinear loop (14) includes a sinking circuit ($Q_7$), such that the translinear loop circuit (14) is responsive to the a sinking current of the sinking circuit and operable to provide a bias current signal proportional to the sinking current.

6 Claims, 1 Drawing Sheet

HIGH OUTPUT VOLTAGE SWING CLASS AB OPERATIONAL AMPLIFIER OUTPUT STAGE

This application claims priority under 35 USC § 119(e)(1) of provisional application No. 60/142,494, filed Jul. 6, 1999.

FIELD OF THE INVENTION

This invention relates generally to the field of operational amplifiers; and, in particular, to an amplifier having minimal zero crossover distortion and quiescent current requirements.

BACKGROUND OF THE INVENTION

Well known in monolithic integrated circuit design, the design of bias circuitry internal to the chip is essential since it determines the internal voltage and current levels over all operating conditions of the integrated circuit as well as over all manufacturing process variations. The industry trend for electronic systems encompassing operational amplifiers is evolving toward lower operating voltages supplied from battery sources. Thus, amplifiers are used in applications requiring low voltage single supply operations in addition to traditionally desired operational amplifier properties such as high input impedance, low input offset voltage, low noise, high bandwidth, high speed and sufficient output drive capabilities.

The operational amplifier consists of at least two stages: an input amplifier stage and an output stage. The input amplifier stage has the task of deriving the difference between the two inputs. The primary purpose of the output stage is voltage amplification. The output stage optionally includes a current boosting scheme which increases the amplifier's load capacity. Conventionally, amplifier output stages have used techniques involving combinations of transistors including npn, pnp and metal oxide semiconductor field effect transistors to satisfy many performance specifications, such as low crossover distortion, high gain factor, large output voltage swings including rail to rail performance, excellent phase and gain margins, low output impedance and symmetrical source and sink capabilities. A well-designed output stage should achieve these performance specifications while consuming low quiescent power and not limiting the frequency response of the amplifier.

During operation, an output stage consumes current from a power supply. A portion of this current, known as the quiescent current, is used to bias the internal circuitry of the output stage. The quiescent current is the current required to bias all transistors on when the input is shorted to ground. The purpose of the quiescent current is to provide sufficient base current for the amplifier's output transistors and current to maintain the amplifier's critical circuitry "on." Low quiescent current is desirable because it reduces power consumption when the amplifier is operating at a light load, or with no load at all. The active components of an all NPN Class AB amplifier include two NPN transistor, wherein the emitter of the first transistor is connected to the collector of the second transistor. The first NPN transistor amplifies the input signal during the positive swing of the signal, and the second NPN transistor amplifies the input signal in its negative swing. The active components may include diodes, resistors and transistors, with increased bias current for the two transistors to reduce crossover distortion.

Traditional Class AB output stages of an operational amplifier are capable of driving a specified minimum impedance load while possessing a low quiescent current. Traditional Class AB output stage "sink" or "source" a significantly larger current in the presence of low impedance loads. Without a quiescent current large enough to bias all transistors critical to the output stage, these transistors will be "cut off" in an effort to drive a low impedance load. Turning this critical circuitry on again, ready for the next amplifier output transition increases crossover distortion.

Conventional AB class output stages drive a minimum impedance load having a given crossover distortion. Where lower impedance loads exist, higher quiescent current is required within the output stage. Going beyond output stage's specified limits of load results in increasingly considerable crossover distortion.

In conclusion, there are existing designs that minimize crossover distortion of the output stages of an amplifier by allowing the active devices to conduct a small amount of current at the crossover point. Some arrangements use both NPN and PNP output transistors which requires more space and operates slower than an all NPN output transistor arrangement. An arrangement utilizing all PNP transistors also requires more space and operates slower than an all NPN output transistor arrangement. These techniques are limited by the quiescent current; hence, a need exists for an output stage that significantly minimizes crossover distortion using an all NPN output transistor arrangement with no quiescent current requirements.

SUMMARY OF THE INVENTION

The present invention relates to an output stage, having transistors of the same polarity type, which function to amplify the input signal at a wide range of frequencies, with low power consumption and low crossover distortion. By biasing the output transistors to remain on during both the positive and negative voltage swing of the input signal, low power consumption as well as low output crossover distortion is achieved. A high efficiency, low crossover distortion, current amplifier circuit for amplifying an input signal in accordance with this present invention includes an output driver, a transistor, a resistor, a current source and a translinear loop circuit. The output driver includes a sourcing circuit. The current source, connected to the output driver, provides bias current to the sourcing circuit. The value of the resistor determines whether the transistor remains on at all times and should not be set such that reverse bias occurs in the sourcing circuit. This resistor enhances the ratio of transistor emitter area between the transistor and a second transistor of the sourcing circuit. The translinear loop circuit, connected to the output driver, receives the input signal. The translinear loop includes a sinking circuit, such that the translinear loop circuit is responsive to the sinking current signal and operable to provide a bias current signal proportional to the sinking current.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF THE PREFERRED EMBODIMENTS

Figure 1:
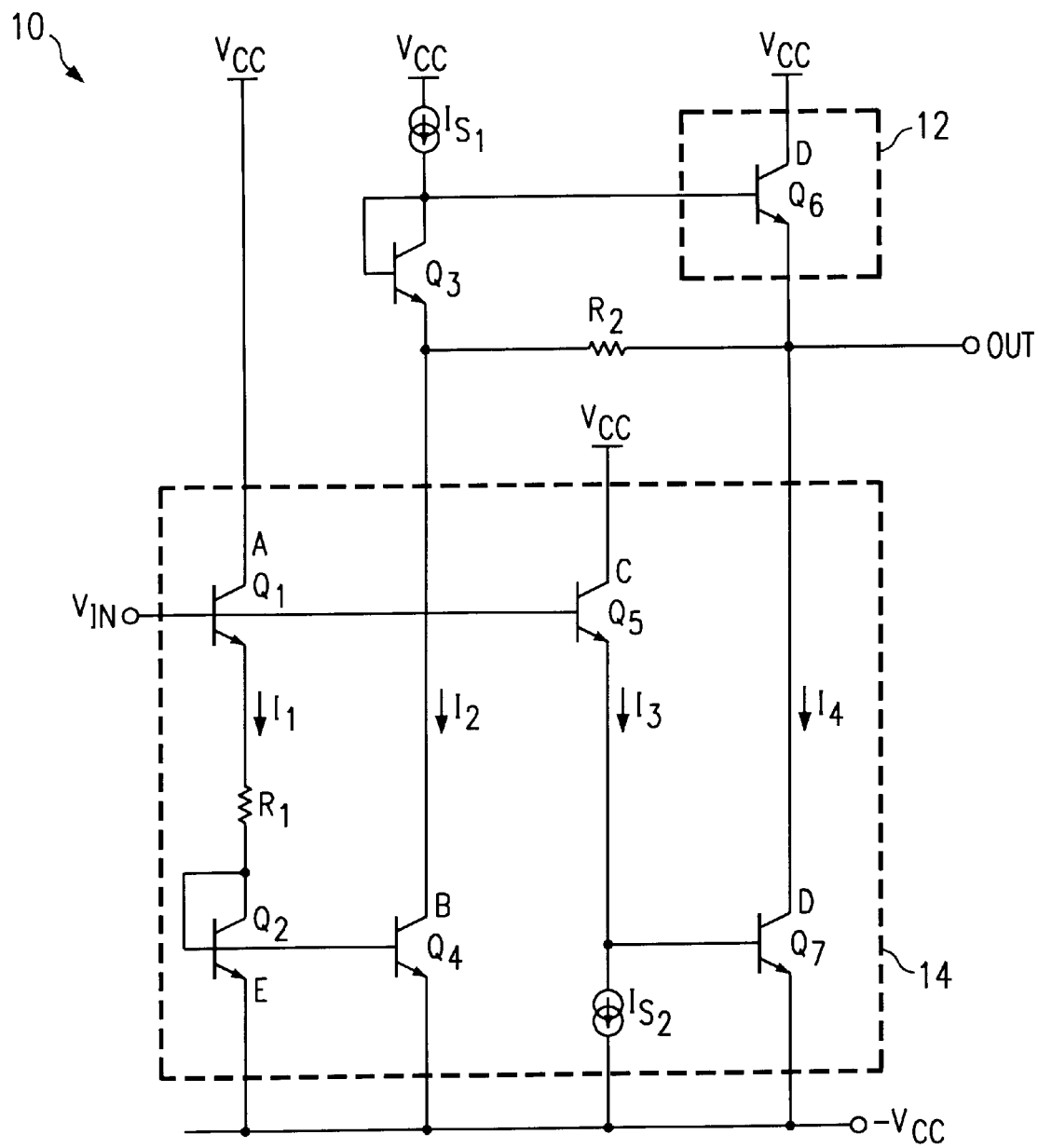
FIG. 1 is a schematic of an embodiment of an output stage in accordance with the present invention.

FIG. 1 illustrates an output stage 10 in accordance with the present invention. This high efficiency, low crossover distortion, output stage 10 includes a current source $I_{S1}$, an output driver 12, a biasing transistor $Q_3$, a resistor $R_2$ and a translinear loop 14. The translinear loop 14 includes transistors $Q_1$ $Q_2$, $Q_4$, $Q_5$, and $Q_7$, a resistor $R_1$, and a second current source $I_{S2}$, Current source $I_{S2}$ not only biases the translinear loop 14 but also increases the speed of this Darlington pair. The output driver 12 comprises sourcing circuit which includes a sixth transistor $Q_6$. The collector of the first transistor $Q_1$ is connected to a first power supply rail having a positive biasing potential $+V_{CC}$. An input node $V_{IN}$ is connected to the base of the first transistor $Q_1$. The first resistor $R_1$ is connected to the emitter of the first transistor $Q_1$. The collector and the base of the second transistor $Q_2$ are connected to resistor $R_1$. $R_1$ is optional since it serves primarily to keep the quiescent current low. The emitter of the second transistor $Q_2$ is connected to a second power supply rail $-V_{CC}$. The first current source $I_{S1}$ is connected to the first power supply rail $+V_{CC}$. The collector and base of the third transistor $Q_3$ are connected to the first current source $I_{S1}$, The collector of the fourth transistor $Q_4$ is connected to the emitter of the third transistor $Q_3$. The base of the fourth transistor $Q_4$ is connected to the base of the second transistor $Q_2$. The emitter of the fourth transistor $Q_4$ is connected to the second power supply rail $-V_{CC}$. The collector of the fifth transistor $Q_5$ is coupled to the first power supply rail $+V_{CC}$, while the base of the fifth transistor $Q_5$ is connected to the base of the first transistor $Q_1$. The second current source $I_{S2}$ is connected between the emitter of the fifth transistor $Q_5$ and the second power supply rail $-V_{CC}$. The base of the seventh transistor $Q_7$ is connected to tile second current source $I_{S2}$ and the emitter of the seventh transistor $Q_7$ is connected to the second power supply rail $-V_{CC}$. Current source $I_{S2}$ biases transistor $Q_5$ and helps to bias the translinear loop. It helps to keep transistor $Q_5$ on when the circuit 10 is in sinking mode. Transistors $Q_5$ and $Q_7$ form a Darlington pair. The collector of the sixth transistor $Q_6$ is connected to the first power supply rail $+V_{CC}$. The base of the sixth transistor $Q_6$ is connected to the collector of the third transistor $Q_3$. The emitter of the sixth transistor $Q_6$ is connected to an output node OUT. The second resistor $R_2$ is connected between the emitter of the third transistor $Q_3$ and the output node OUT. The collector of the seventh transistor $Q_7$ is connected to the output node OUT.

Transistors $Q_6$ and $Q_7$ are the output transistors of the output stage 10. When the AC input signal applied to input node $V_{IN}$ is in the positive range, or is above the crossover point, the circuit is said to be "sinking current" through the output node OUT. Transistor $Q_1$ is on, drawing current $I_1$ from the first power supply rail $+V_{CC}$. Current $I_1$ of transistor $Q_1$ flows through resistor $R_1$ and transistor $Q_2$. Since transistors $Q_2$ and $Q_4$ form a current mirror, current $I_2$ is equivalent to $I_1 A_{Q2}/A_{Q4}$, where $A_{Q1}$ and $A_{Q2}$ are the emitter areas of transistors $Q_1$ and $Q_2$. Current $I_2$ flowing through transistor $Q_4$ comprises the current that is generated by the current source $I_{S1}$ and the current that flows across resistor $R_2$ from the output node OUT. The current $I_3$ of transistor $Q_5$ is equal to the current from the second current source $I_{S2}$ added to the current $I_{base}$ applied to the base of transistor $Q_7$, such that transistor $Q_7$ is biased by the translinear loop formed by transistors $Q_1$, $Q_2$, $Q_4$, $Q_5$ and $Q_7$.

The voltage developed across $R_2$ should not be large enough to reverse bias the base emitter junction of transistor $Q_6$. A small amount of current generated by the current source $I_{S1}$ is applied to the base of sourcing transistor $Q_6$. Thus, the output transistor $Q_6$ remains on when the output transistor $Q_7$ is sinking current.

More particularly, when AC input signal applied to input node $V_{IN}$ has a positive voltage swing, the voltage applied to the base of transistors $Q_1$ and $Q_5$ is positive and thus, the emitter voltage of transistor $Q_1$ and $Q_5$ is positive as well. The positive voltage applied to the base of both transistors $Q_1$ and $Q_5$ increases the current $I_1$ and $I_3$ that flows through each transistor $Q_1$ and $Q_5$, respectively. Current $I_1$, flowing through resistor $R_1$ and transistor $Q_2$, increases. Since current $I_2$ is the mirror of current $I_1$, current $I_2$ increases relative to the increase in current $I_1$. The increase in current $I_2$ is drawn from the current supplied by the current source $I_{S1}$ and the current through the output node OUT across resistor $R_2$. As a result, less current is applied to the base of transistor $Q_6$. Transistor $Q_6$, however, is left with enough current to keep it on; yet, it does not source any current through the output node OUT.

Transistor $Q_5$ is more sensitive to changes in the input voltage applied at input node $V_{IN}$ than transistor $Q_1$. The emitter voltage of transistor $Q_5$ is applied to the base of transistor $Q_7$. Since the input voltage $V_{IN}$ increases the base emitter voltage of transistor $Q_5$ with respect to $-V_{CC}$, a positive voltage is applied to the base of transistor $Q_7$. As a result, the collector voltage of $Q_7$ is negative—the output stage 10 is thus sinking current. Due to the increase in current $I_3$ through transistor $Q_5$, more current is applied to the base of transistor $Q_7$. Accordingly, transistor $Q_7$ sinks more current.

Transistors $Q_1$, $Q_2$, $Q_4$, $Q_5$, and $Q_7$ form a translinear loop. The Kirchoff's voltage equation provides that:

$$Vbe_{Q1}+Vbe_{Q4}=Vbe_{Q5}+Vbe_{Q7}, \text{ assuming } R_1=0 \quad (1)$$

$$V_t\ln(I_1/A_{Q1}I_S)+V_t\ln(I_2/A_{Q4}I_S)=V_t\ln(I_3/A_{Q5}I_S)+V_t\ln(I_4/A_{Q7}I_S) \quad (2)$$

$$I_4=I_{sink}=(I_1 I_2 A_{Q5} A_{Q7})/(A_{Q1} A_{Q4} I_3) \quad (3)$$

where $Vbe_{Q1}$, $Vbe_{Q4}$, $Vbe_{Q5}$, and $Vbe_{Q7}$ represent the base-emitter voltages of transistors $Q_1$, $Q_4$, $Q_5$, and $Q_7$, respectively. Areas $A_{Q1}$, $A_{Q4}$, $A_{Q5}$, and $A_{Q7}$ represent the emitter area of each respective transistor. Current $I_S$ is the inverse saturation current. Thus, the sinking current $I_{sink}$ is proportional to the boosting current $I_2$ of transistors $Q_3$ and $Q_4$. Since transistors $Q_2$ and $Q_4$ form a current mirror, current $I_2$ is equivalent to $I_1 A_{Q2}/A_{Q4}$, where $A_{Q1}$ and $A_{Q2}$ are the emitter areas of transistors $Q_1$ and $Q_2$. Thus, the sinking current $I_{sink}$ is proportional to the square of the current provided by the input signal or the current source $I_{S1}$.

The sinking current $I_{sink}$ becomes very large when $I_1$ and $I_2$ have unlimited supply current. The power supply generates current $I_1$. Current $I_2$ comprises current from the current source $I_{S1}$ and the current being sourced from the output node OUT through resistor $R_2$. During sinking conditions, the only current drive limitation is determined by the available base current to transistor $Q_5$ and $Q_7$. More particularly, this current is represented by $Isink/hfe_{Q5}*hfe_{Q7}$; since:

$I_4=I_{B7}\ hfe_{Q7}$ $I_{C5}=I_{B5}\ hfe_{Q5}$ $I_{sink}=I_{B5}\ hfe_{Q5}\ hfe_{Q7}$ $I_{B5}=I_{sink}/hfe_{Q5}\ hfe_{Q7}$ Thus, there is no significant limiting factor for the current in the output stage sinking current from a given load.

The circuit significantly depreciates crossover distortion in the output signal, by keeping transistors $Q_6$ and $Q_7$ on at all times. As the input signal applied to input node $V_{IN}$ approaches the crossover point during either a falling transition, the amount of current $I_2$ drawn from the current source $I_{S1}$ is reduced. When the input signal applied to input node $V_{IN}$ reaches the crossover point, the amount of current drawn by transistor $Q_3$ is minimal yet the transistors $Q_3$ and $Q_4$ remain biased on. At this stage, virtually no load current is being supplied by the circuit.

When the input voltage applied to input node $V_{IN}$ is at the crosspoint or is negligible, the current $I_3$ through transistor $Q_5$ will be approximately equal to current from current source $I_{S2}$. Current $I_1$ flows through transistors $Q_1$ and $Q_2$ and resistor $R_1$. The current source $I_{S1}$ 'quiescently' biases transistors $Q_3$ and $Q_6$. Current $I_4$ is not large enough to sink current from the output load. The base-emitter voltage of transistor $Q_7$ influences current $I_3$ which flows through transistor $Q_5$. The base-emitter voltage of transistor $Q_5$ is set by the current $I_3$. Since the bases of transistors $Q_1$ and $Q_5$ are coupled together the base-emitter voltage of transistor $Q_1$ added to the base-emitter voltage of $Q_2$ is the same as the base-emitter voltage of transistor $Q_5$ added to the base-emitter voltage of transistor $Q_7$. Current $I_1$ is determined by the sum of base-emitter voltages of transistors $Q_1$ and $Q_2$. Since transistors $Q_2$ and $Q_4$ form a current mirror, current $I_2$ is equivalent to $I_1 A_{Q2}/A_{Q4}$. Resistor $R_2$ is set such that no current comes through the output node OUT to be added to current $I_2$. Thus, current $I_2$ equals the current from current source $I_{S1}$ solely. In summary, at the quiescent point, all transistors are conducting current and are set by the current source $I_{S1}$.

When the input voltage applied to input node $V_{IN}$ swings in the negative direction, the voltage across transistors $Q_1$ and $Q_5$ is negative. The negative voltage is applied to the base of transistors $Q_1$, $Q_2$, and $Q_4$. The collector voltage of transistor $Q_4$, however, is positive. This positive voltage is applied to the emitter of transistor $Q_3$. As a result, this positive voltage is applied the base and collector of transistor $Q_3$ and to the base of transistor $Q_6$. At this point, the amount of current $I_2$ drawn from the current source $I_{S1}$ decreases. Yet, the amount of current drawn by transistor $Q_3$ is maximum. A large amount of current from current source $I_{S1}$ is applied to the base of transistor $Q_6$. At this point, transistor $Q_6$ conducts current. The circuit is said to be "sourcing current" through the output node OUT to a load connected to the output node OUT.

The dynamic biasing which boosts transistor $Q_6$ during sourcing mode of the output stage depends upon the amount of current through transistor $Q_3$ and resistor $R_2$. If the resistance of resistor $R_2$ is small enough to make the voltage across it to be zero, then the ratio of the emitter area of transistors $Q_3$ to $Q_6$ biases the output transistor $Q_6$ during the sourcing mode of the output stage. It is the purpose of resistor $R_2$ to enhance the ratio of transistor's $Q_3$ and $Q_6$ emitter area during sourcing mode to provide a larger ratio, such that a small current through transistor $Q_3$ results in sourcing a large current through transistor $Q_6$. Using Kirchoff's voltage equation rules, the base-emitter voltage of transistor $Q_6$ is equal to the voltage across resistor $R_2$ added to the base-emitter voltage of transistor $Q_3$.

Since current $I_2$ decreases, current $I_3$ decreases and, as a result, the base-emitter voltage of transistor $Q_7$ decreases. Transistor $Q_7$, however, remains on. Transistor $Q_7$ is more likely to remain "on" during sourcing since the translinear loop will tend to keep all transistors operating as long as a small amount of current flows through transistor $Q_4$. Since the current path to transistor $Q_7$ is through transistors $Q_3$ and $Q_5$, as well as resistor $R_2$, transistor $Q_7$ will remain "on" as long as the voltage drop across $R_2$ is maintained under couple hundred millivolts. In addition, the value of resistor $R_2$ determines whether $Q_3$ remains "on."

Those skilled in the art to which the invention relates will appreciate that various substitutions, modifications and additions can be made to the described embodiments, without departing from the spirit and scope of the invention as defined by the claims.

What is claimed is:

1. A high efficiency, low crossover distortion, current amplifier circuit having an input and output node for amplifying an input signal comprising:
   a first current source for providing bias current to a sourcing circuit coupled to a first power supply rail;
   an output driver coupled to the first current source and the output node, the output driver including a sourcing circuit;
   a first transistor having a collector, base and emitter, the base and collector coupled to the current source;
   a resistor coupled between the emitter of the first transistor and the output node; and
   a translinear loop circuit coupled to the input node, the first transistor, and the output driver, the translinear loop circuit comprising,
      a sinking circuit having a second transistor including a collector, base and emitter, the translinear loop circuit responsive to a sinking current of the sinking circuit and operable to provide a bias current signal proportional to the sinking current,
      a third transistor having a collector, base and emitter, the collector coupled to the first power supply rail, the base coupled to the input node,
      a second resistor coupled to the emitter of the third transistor,
      a fourth transistor having a collector, base and emitter, the collector and base coupled to the second resistor, the emitter coupled to a second power supply rail,
      a fifth transistor having a collector, base and emitter, the base coupled to the base of the fourth transistor, the emitter coupled to the second power supply rail, the collector coupled to the emitter of the first transistor,
      a sixth transistor having a collector, base and emitter, the collector coupled to the first power supply rail, the base coupled to the input node,
      a second current source coupled between the emitter of the sixth transistor and the second power supply rail, the second current source coupled to the sourcing circuit, and
      wherein the collector of the second transistor of the sinking circuit is coupled to the output node, the base of the second transistor of the sinking circuit is coupled to the second current source, and the emitter of the second transistor of the sinking circuit is coupled to the second power supply rail.

2. The high efficiency, low crossover distortion, current amplifier circuit as claimed in claim 1, wherein the sourcing circuit includes a seventh transistor having a collector, base and emitter, the collector coupled to the first power supply rail, the base coupled to the first current source, and the emitter coupled to the output node.

3. A high efficiency, low crossover distortion, current amplifier circuit having an input and output node comprising:
   a first transistor having a base, an emitter and a collector, the collector coupled to a first power supply rail, the base coupled to the input node;
   a first resistor coupled to said emitter of said first transistor;
   a second transistor having a base, an emitter and a collector, the collector and the base of the second transistor coupled to the resistor, said emitter of the second transistor coupled to a circuit a second power supply rail;

a first current source coupled to the first power supply rail;

a third transistor having a base, an emitter and a collector, the collector and the base of the third transistor coupled to the first current source;

a fourth transistor having a base, an emitter and a collector, the collector coupled to the emitter of the third transistor, the base coupled the base of the second transistor, the emitter coupled to the second power supply rail;

a fifth transistor having a base, an emitter and a collector, the collector coupled to the first power supply rail, the base coupled the input node;

a second current source coupled between the emitter of the fifth transistor and the second power supply rail;

a sixth transistor having a base, an emitter and a collector, the collector coupled to the first power supply rail, the base coupled the first current source, the emitter coupled to the output node;

a second resistor coupled between the emitter of the third transistor and the output node; and a seventh transistor having a base, an emitter and a collector, the collector coupled to the output node, the base coupled to the second current source, the emitter coupled to the second power supply rail.

4. The current amplifier circuit as claimed in claim 3 wherein the first, second, third, fourth, fifth, sixth and seventh transistors have the same polarity type.

5. The current amplifier circuit as claimed in claim 3 wherein the first, second, third, fourth, fifth, sixth and seventh transistors are NPN transistors.

6. The current amplifier circuit as claimed in claim 3 wherein the first, second, third, fourth, fifth, sixth and seventh transistors are PNP transistors.

* * * * *